United States Patent
Rakshit et al.

(10) Patent No.: US 10,424,581 B2
(45) Date of Patent: Sep. 24, 2019

(54) SUB 59 MV/DECADE SI CMOS COMPATIBLE TUNNEL FET AS FOOTER TRANSISTOR FOR POWER GATING

(71) Applicant: Samsung Electronics Co., Ltd., Suwon-si, Gyeonggi-do (KR)

(72) Inventors: Titash Rakshit, Austin, TX (US); Mark Rodder, Dallas, TX (US); Rwik Sengupta, Austin, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/276,768

(22) Filed: Sep. 26, 2016

(65) Prior Publication Data

US 2017/0301672 A1  Oct. 19, 2017

Related U.S. Application Data

(60) Provisional application No. 62/324,291, filed on Apr. 18, 2016.

(51) Int. Cl.

| | |
|---|---|
| H01L 27/092 | (2006.01) |
| H01L 29/66 | (2006.01) |
| H01L 21/8238 | (2006.01) |
| H01L 29/167 | (2006.01) |
| H01L 23/522 | (2006.01) |
| H01L 23/528 | (2006.01) |
| H01L 29/739 | (2006.01) |
| H01L 29/08 | (2006.01) |

(Continued)

(52) U.S. Cl.
CPC .... *H01L 27/092* (2013.01); *H01L 21/823814* (2013.01); *H01L 21/823828* (2013.01); *H01L 21/823871* (2013.01); *H01L 23/528* (2013.01); *H01L 23/5226* (2013.01); *H01L 29/0834* (2013.01); *H01L 29/165* (2013.01); *H01L 29/167* (2013.01); *H01L 29/66545* (2013.01); *H01L 29/66977* (2013.01); *H01L 29/7391* (2013.01); *H01L 27/0629* (2013.01)

(58) Field of Classification Search
CPC ...................................................... H01L 27/092
USPC .............................................. 257/9; 438/286
See application file for complete search history.

(56) References Cited

U.S. PATENT DOCUMENTS

| 8,362,604 B2 | 1/2013 | Ionescu |
| 8,698,254 B2 | 4/2014 | Tomioka et al. |

(Continued)

FOREIGN PATENT DOCUMENTS

WO   WO 2015/147849 A1   10/2015

OTHER PUBLICATIONS

Double gate vertical tunnel FET for hybrid CMOS-TFET based low standby power logic circuits. Abhishek Mishra, Manisha Pattanaik, Varun Sharma. International Conference on Microelectronics, Communication and Renewable Energy (ICMiCR-2013) (Year: 2013).*

(Continued)

*Primary Examiner* — Igwe U Anya
(74) *Attorney, Agent, or Firm* — Lewis Roca Rothgerber Christie LLP

(57) ABSTRACT

An integrated circuit (IC) including a circuit block including a plurality of complementary metal oxide semiconductor field-effect transistors (CMOSFETs), and a tunnel field-effect transistor (TFET) between the circuit block and ground for power gating the circuit block.

17 Claims, 3 Drawing Sheets

(51) Int. Cl.
*H01L 29/165* (2006.01)
*H01L 27/06* (2006.01)

(56) References Cited

U.S. PATENT DOCUMENTS

| | | | |
|---|---|---|---|
| 9,117,893 B1 | 8/2015 | Hu et al. | |
| 9,613,955 B1* | 4/2017 | Anderson | H01L 27/0886 |
| 9,985,611 B2* | 5/2018 | Morris | H03K 3/356113 |
| 2010/0163845 A1* | 7/2010 | Goel | H01L 29/205 |
| | | | 257/24 |
| 2011/0147838 A1* | 6/2011 | Gossner | H01L 29/7391 |
| | | | 257/345 |
| 2011/0215425 A1* | 9/2011 | Loh | H01L 29/78 |
| | | | 257/410 |
| 2015/0129926 A1* | 5/2015 | Xiao | H01L 29/66977 |
| | | | 257/105 |
| 2015/0333534 A1 | 11/2015 | Liu et al. | |
| 2016/0056278 A1 | 2/2016 | Avci et al. | |
| 2016/0079400 A1 | 3/2016 | Huang et al. | |
| 2016/0182023 A1* | 6/2016 | Morris | G11C 11/412 |
| | | | 365/156 |
| 2016/0268256 A1* | 9/2016 | Yang | H01L 27/088 |
| 2017/0103979 A1* | 4/2017 | Sedighi | H01L 29/78648 |
| 2017/0110179 A1* | 4/2017 | Thomas | G11C 11/412 |

OTHER PUBLICATIONS

Sharma, Ankit et al., "P-channel Tunneling Field Effect Transistor (TFET): Sub-10nm Technology Enablement by GaSb—InAs with Doped Source Underlap," School of Electrical and Computer Engineering, Purdue University, West Lafayette IN, (pp. 151-152).

\* cited by examiner

SUB 59 MV/DECADE SI CMOS COMPATIBLE TUNNEL FET AS FOOTER TRANSISTOR FOR POWER GATING

CROSS-REFERENCE TO RELATED APPLICATION(S)

This application claims priority to, and the benefit of, U.S. Provisional Application 62/324,291, filed on Apr. 18, 2016 in the U.S. Patent and Trademark Office, the entire content of which is incorporated herein by reference.

FIELD

One or more aspects of embodiments according to the present invention generally relate to integrated circuits, and more particularly, relate to power saving techniques applied to integrated circuits.

BACKGROUND

Standby power is electric power that is consumed by electronics when they are in, for example, a sleep mode, a hibernate mode, or a standby mode. Although an electronic device may appear (at its interface) to be turned off, the electronic device is not necessarily disconnected from a corresponding power supply for driving the microprocessor of the electronic device. The power supply in hibernate/standby mode is suitable to preserve the volatile electronic charge states in a microprocessor. If power is disconnected, all the stored states (in terms of volatile electronic charges) should be off-loaded to main memory, and should be fed back to the microprocessor at wake up, which is an expensive and time-consuming process that is not preferred. Accordingly, power supply is lowered to a voltage Vccmin (e.g., a minimum voltage in the range of 0.4V to 0.7V that can be achieved without disturbing electronic charge states), and standby power is used by the electronic device while the electronic device is in standby mode, and is therefore not performing its primary function, such that the electronic device may be activated by a corresponding signal to switch from standby mode.

Overall chip leakage is severely limited by leaky, high performance, low threshold voltage devices within the electronic device. As feature sizes of electronic devices continue to scale, transistors within the electronic devices are scaling as well, thereby increasing leakage current associated with the standby mode. Accordingly, different methods and circuit configurations may be used to reduce overall leakage of the electronic device.

A popular technique to reduce leakage is referred to as "power gating." Power gating is a technique used in integrated circuit design that reduces power consumption by inserting a low leakage transistor at a circuit block of leaky transistors.

For example, power gating may use transistors, such as n-channel metal-oxide-semiconductor field-effect transistors (NMOS transistors), as footer switches to effectively lower the leakage current flowing through a power gated block/circuit when the block/circuit is in standby mode. That is, an NMOS transistor may be placed between the circuit block of CMOS transistors and ground as a footer switch, with the footer switch enabled during sleep mode.

SUMMARY

Aspects of embodiments of the present disclosure are directed toward an integrated circuit, such as a logic microprocessor, including a tunnel field-effect transistor (TFET) for power gating a circuit block of the integrated circuit, and are directed toward a method of manufacturing the same.

According to an embodiment of the present invention, there is provided an integrated circuit (IC) including a circuit block including a plurality of complementary metal oxide semiconductor field-effect transistors (CMOSFETs), and a tunnel field-effect transistor (TFET) between the circuit block and ground for power gating the circuit block.

A subthreshold slope of the TFET may be less than or equal to about 59 mV/decade at room temperature.

The TFET may include a group IV material.

The TFET may include a drain region and a source region, and dopants of CMOSFETs of the circuit block and dopants of the drain region of the TFET or of the source region of the TFET may include a group V or group III material.

A gate region of the TFET may overlap a source region of the TFET to a greater degree than the gate region of the TFET overlaps a drain region of the TFET.

The TFET may be an n-type TFET.

The TFET may be connected through a Via1 to a virtual ground terminal metal at a Metal1 level of the IC.

The TFET may have a gate length that is greater than or equal to about twice a gate length of an average CMOSFET of the circuit block.

The TFET may have a width that is greater than or equal to about five times a width of an average CMOSFET of the circuit block.

According to another embodiment of the present invention, there is provided a method of integrated circuit (IC) fabrication, the method including preparing a silicon substrate, masking off TFET regions, preparing CMOSFETs corresponding to a circuit block of the IC, unmasking the TFET regions, and preparing the TFETs at the TFET regions, wherein the TFETs are for power gating the circuit block.

Preparing the TFETs at the TFET regions may include preparing gates of the TFETs, forming nitride spacers on both sides of the gates, and doping the TFET regions.

Preparing the gates of the TFETs may include reusing gate length masks used for preparing input/output (I/O) or static random-access memory (SRAM) devices.

Doping the TFET regions may include doping the TFET region with p-type dopants, masking gate regions and source regions of the TFET regions, doping drain regions of the TFET regions, unmasking the source regions and masking the drain regions, recessing a silicon layer, and doping the TFET regions with p-type dopants.

Preparing the gates may include forming gate lengths of the TFETs to be longer than gate lengths of the CMOSFETs of the circuit block.

Preparing the TFETs at the TFET regions may further include forming replacement metal gates as gates of the TFETs.

Forming replacement metal gates as gates of the TFETs may include depositing a high dielectric constant oxide and an appropriate n-type workfunction metal.

The method may further include connecting the TFETs to a virtual ground terminal of the circuit block at a Metal1 level of the IC.

Preparing the TFETs at the TFET regions may include forming the TFETs to be wider than the CMOSFETs of the circuit block.

According to yet another embodiment of the present invention, there is provided a logic microprocessor including a circuit block including CMOSFETs, and one or more TFETs for power gating the circuit block.

BRIEF DESCRIPTION OF THE DRAWINGS

These and other aspects of the present invention will be appreciated and understood with reference to the specification, claims, and appended drawings wherein:

DETAILED DESCRIPTION

Figure 1:
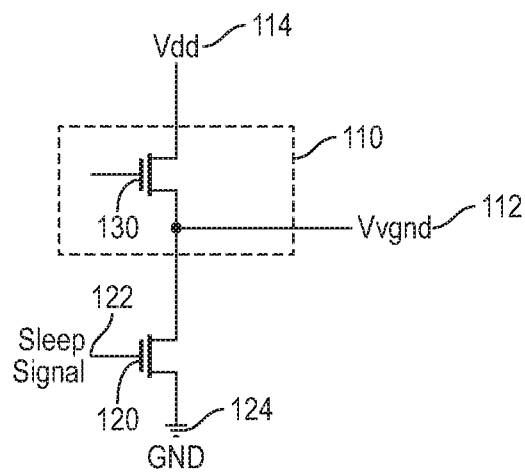
FIG. 1 is a block diagram of a power gated circuit block that is power gated using a complementary metal oxide semiconductor field-effect transistor (CMOSFET) as a footer switch.

Aspects of embodiments of the present disclosure are directed toward an integrated circuit, such as a logic microprocessor, including a tunnel field-effect transistor (TFET) for power gating a circuit block of the integrated circuit, and are directed toward a method of manufacturing the same.

Features of the inventive concept and methods of accomplishing the same may be understood more readily by reference to the following detailed description of embodiments and the accompanying drawings. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it may be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention. As used herein, the terms "use," "using," and "used" may be considered synonymous with the terms "utilize," "utilizing," and "utilized," respectively.

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a block diagram of a power gated circuit block that is power gated using a complementary metal oxide semiconductor field-effect transistor (CMOSFET) as a footer switch.

Referring to FIG. 1, when a circuit of an electronic device, such as a microprocessor, is in a standby/hibernate/sleep mode, the electronic device is generally still drawing a small amount of current. That is, while in the standby mode, the microprocessor continues to consume power due to leakage currents flowing through transistors that form the integrated circuit of the microprocessor. Accordingly, although the electronic device does not appear to be performing, at least at the user interface of the electronic device, a relatively small amount of electricity will continue to flow through one or more of the circuits of the electronic device as leakage current, which may be on the order of nano amps or pico amps per micrometer.

For a combinational or sequential circuit block, power gating may be used to reduce leakage current of the circuit block when in a sleep mode, a hibernate mode, or a standby mode, and to thereby reduce power consumption when in any of these modes. For example, a footer transistor 120 may be added between a ground rail (e.g., ground GND 124) and a virtual ground Vvgnd 112. The footer transistor 120 may be a MOSFET, such as an n-channel metal-oxide-semiconductor field-effect (NMOS) transistor, that has characteristics of a high threshold voltage (Vt), low leakage, and lower drive current.

Accordingly, the footer transistor 120 may sink the leakage current of the device or circuit block 110 to which it is attached.

Upon receiving a signal for causing the circuit block 110 to "wake up" (e.g., a "wake up signal" applied to the gate 122 of the footer transistor 120), the footer transistor 120 may switch to the on state to allow current to flow to ground GND 124 through the circuit block 110. At wake up (i.e., during the process that occurs when the footer transistor 120 receives the wake up signal applied to its gate 122, thereby causing the footer transistor 120 to come out of standby mode), the virtual ground Vvgnd 112 discharges (e.g., to attain a voltage of approximately 0 volts). Although there is a finite latency associated with the wakeup process of the footer transistor 120, the wakeup process should be relatively fast, and should use relatively low switching power, so that performance costs associated with going into and coming out of the standby mode is not too high.

Accordingly, by inserting a low leakage footer transistor 120 between the circuit block 110 and ground GND 124, an amount of current flowing through the circuit block 110 during a sleep mode may be reduced. This may be achieved by enabling the footer transistor 120 upon activation of the sleep/standby mode to sink lower leakage current to ground.

However, the degree to which power is saved by power gating the circuit block 110 with an NMOS footer transistor 120 is limited by the fact that a MOSFET drain current subthreshold swing is theoretically limited to about 59 mV/decade of current at room temperature. This limit can be described by the thermal Maxwell-Boltzmann tail of carriers.

Furthermore, MOSFET scaling in a sub-100 nm regime comes with increased leakage power of the microprocessor. By reducing dimensions of the MOSFET (e.g., the NMOS footer transistor 120), especially when reducing gate lengths of the MOSFETs, MOSFET leakage increases exponentially. In addition to increased leakage caused by the smaller dimensions, supply voltage Vdd 114 scaling indirectly adds to device leakage, and hence also adds to overall microprocessor leakage. A scaled supply voltage Vdd 114 requires lowering of a device threshold voltage Vt to keep overdrives at the same level. This in turn further increases overall leakage of the MOSFET. Accordingly, benefit may be attained by using a power gating device that overcomes the limitations of a conventional MOSFET footer transistor 120.

The MOSFET drain current subthreshold swing referred to above is a metric that corresponds to how quickly (in terms of voltage) a corresponding transistor (e.g., the footer transistor 120 of FIG. 1) is able to switch from an off state to an on state. Although conventional MOSFETs have a drain current subthreshold swing of about 59 mV/decade of current at room temperature, a relatively new type of transistor, referred to as a tunnel field-effect transistor (TFET), is able to theoretically achieve a subthreshold swing of about 59 mV/decade or less. Accordingly, a TFET can exhibit a subthreshold slope that is significantly less than 59 mV/decade, and is therefore typically able to switch from an off state to an on state more quickly than a conventional MOSFET.

Figure 4:
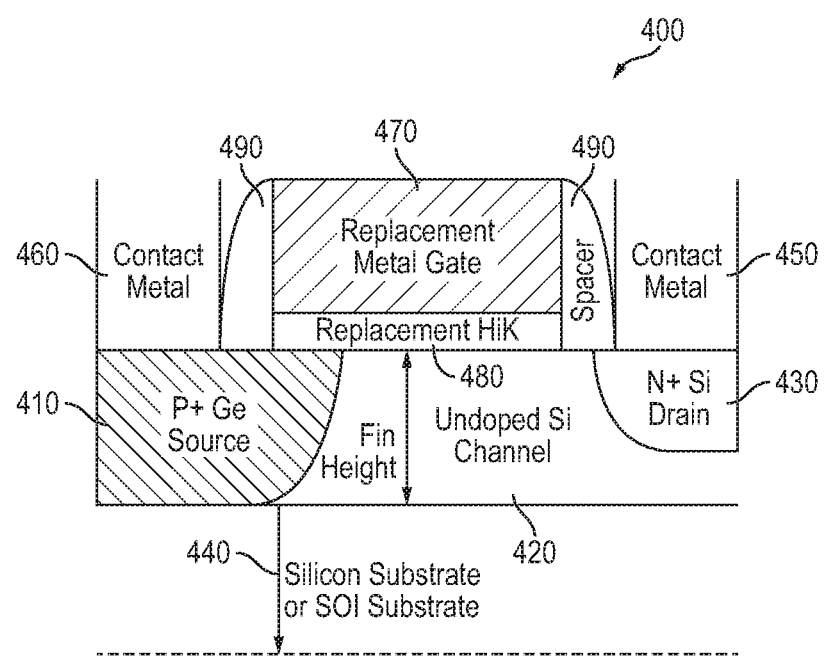
FIG. 4 is a schematic of a TFET device in FinFET configuration, according to an embodiment of the present invention.

FIG. 4 is a schematic of a TFET device in FinFET configuration, according to an embodiment of the present invention.

Referring to FIG. 4, the TFET 400 of the present embodiment comprises an n-doped drain region 430 (e.g., doped with arsenic), an undoped (or substantially undoped or lightly doped) silicon channel region 420, and a p-doped source region 410 (e.g., doped with boron or some other group III element). The TFET 400 is fabricated on a SOI (silicon-on-insulator) substrate or on bulk silicon substrate 440. Above the drain region 430 and the source region 410 are respective contact metals 450 and 460, which are respectively used as a drain terminal 450 and a source terminal 460 of the TFET 400. A replacement metal gate/gate terminal 470 is located above the silicon channel region 420, and may be separated from the silicon channel region 420 by a replacement HiK 480. Additionally, spacers 490 may be used to separate the contact metals 450 and 460 from the gate terminal 470. Furthermore, the gate terminal 470 of the TFET 400 may overlap the source region 410 to a greater degree than the gate terminal 470 overlaps the drain region 430 (e.g., the source region 410 may overlap the gate terminal 470 by about 5 nanometers or more, or may overlap the gate terminal 470 by more than about 10 nanometers).

Despite having a structure that is similar to the structure of a conventional MOSFET, the fundamental switching mechanism of the TFET 400 differs from that of the MOSFET. The difference in the switching mechanism is that the TFET 400 switches between on and off states by modulating quantum tunneling through a barrier, whereas a conventional MOSFET will modulate thermionic emission over a barrier to switch between on and off states. This difference in the switching mechanism enables the TFET 400 to outperform the MOSFET (e.g., the footer transistor 120 in FIG. 1) in this regard, and also enables the TFET 400 to provide reductions in power consumption that are unable to be provided by a conventional MOSFET.

The basic structure of the TFET 400 is similar to that of the conventional MOSFET, although the drain terminal 450 and the source terminal 460 of the TFET 400 are doped oppositely from one another. That is, the basic structure of the TFET 400 will typically consist of a P-I-N (p-type, intrinsic, n-type, for which the p-type and n-type regions can be heavily doped) junction, and the electrostatic potential of the silicon channel region 420 of the TFET 400 is controlled by a gate terminal 470.

The TFET 400 operates by applying a voltage to the gate terminal 470 to create a gate bias, which causes electron accumulation in the silicon channel region 420. When the gate bias is sufficiently high, band-to-band tunneling (BTBT) occurs. That is, when the conduction band of the silicon channel region 420 aligns with the valence band of the p-doped region/source region 410, electrons tunnel from the valence band of the p-doped region/source region 410 into the conduction band of the silicon channel region 420, thereby causing current to flow.

Figure 2:
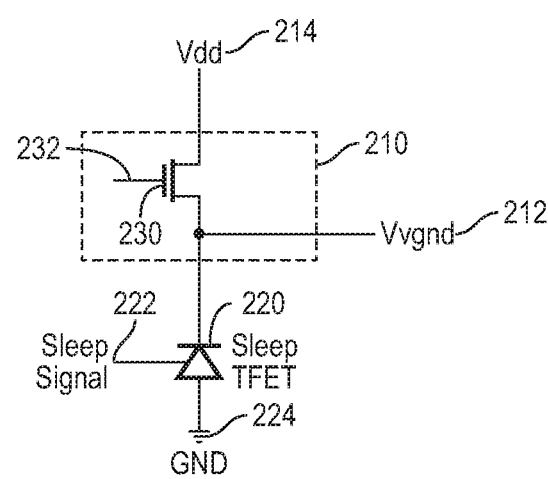
FIG. 2 is a block diagram of a power gated circuit block that is power gated using a tunnel field-effect transistor (TFET) as a footer switch, according to an embodiment of the present invention.

FIG. 2 is a block diagram of a power gated circuit block that is power gated using a tunnel field-effect transistor (TFET) as a footer switch, according to an embodiment of the present invention.

Referring to FIG. 2, a circuit or circuit block 210 (e.g., the circuit block 110 of FIG. 1) can be power gated by using a TFET footer transistor 220, such as the TFET shown in FIG. 4, instead of the NMOS footer transistor 120. By replacing the footer transistor 120 of the circuit shown in FIG. 1 with a lower leakage TFET footer transistor (e.g., an N-type TFET device) 220, power consumption by the circuit block 210 during a sleep mode, a hibernate mode, or a standby mode, as well as an amount of wake up time for switching out of the standby mode, can be further reduced. Although the phrase "standby mode" is used repeatedly throughout the present specification, it should be noted that "standby mode" may be used to refer to a sleep mode, a hibernate mode, or any other power saving mode.

In the present embodiment, a wide, long channel TFET footer transistor 220 is used in place of the NMOS footer transistor 120 shown in FIG. 1. In a typical TFET, the slope of the exponential part of subthreshold leakage is steeper than that of the conventional MOSFET. Direct tunneling-based leakage in the subthreshold region for TFETs overcomes the limit of thermionic leakage in the MOSFET that leads to about 59 mV/decade slope limit at room temperature.

Accordingly, a leakage current savings ratio improves exponentially with the reduced subthreshold slope of the TFET footer transistor 220. For example, transitioning from a theoretical MOSFET minimum subthreshold slope of about 59 mV/decade to a subthreshold slope of about 40 mV/decade of a TFET corresponds to a reduction in leakage current by a factor of 100 or more. Thus, the use of the TFET footer transistor 220 as a footer transistor exhibiting sub-59 mV/decade slope allows significant leakage savings when the device is in standby mode by blocking a greater amount of current flowing from a supply voltage Vdd 214 through the circuit block 210 to ground GND 224 than would otherwise be blocked by a CMOSFET.

By ensuring that the TFET footer transistor 220 is sufficiently wide, the TFET footer transistor 220 will have enough drive to complete wake up/turn on from the standby mode with a very minor penalty for the circuit block 210. The wider TFET footer transistor 220 will not significantly affect the total capacitance of the circuit block 210, as total capacitance is mainly dominated by block transistors (e.g., CMOS block transistors) 230 of the circuit block 210 and their associated interconnects. For example, the TFET footer transistor 220 may have a width that is greater than or equal to 5 times the width of a conventional CMOSFET (e.g., the block transistors 230 of the circuit block 210). The wider TFET footer transistor 220 enables increased drive current, and results in higher capacitance. However, the dominating capacitance for the total circuit block 210 is driven by the characteristics of the block transistors 230 of the circuit block 210 and their associated interconnect capacitance. Thus a wide TFET footer transistor 220 will add a relatively insignificant amount of capacitance to the total load capacitance during wake up.

Additionally, the TFET footer transistor 220 may have a longer gate 222 than that of a conventional CMOSFET (e.g., may have a gate 222 that is longer than the gate 122 of the footer transistor 120 of FIG. 1 or than the gate 232 of the block transistors 230 of the circuit block 210). Longer gate length of the TFET footer transistor 220 enables reduced or eliminated drain-induced barrier lowering that TFETs are otherwise susceptible to, and which would be higher in TFETs than in CMOSFETs having the same gate length. For example, the TFET footer transistor 220 may have a gate length that is two times as long, or more, than the gate length of a conventional CMOSFET (e.g., the block transistors 230 of the circuit block 210). Because only a few footer transistors are used per circuit block for power gating in a typical logic microprocessor, the overall increase in circuit area due to the addition of the TFET footer transistor 220 is not significant despite the use of a wider and longer TFET footer transistor 220. In addition, the leakage of the of the circuit block 210 during standby mode is reduced by a factor of at least 10 to 1000 when compared to a circuit block power gated by a conventional footer transistor, such as circuit block 110 shown in FIG. 1.

It should be noted that the CMOS block transistors 230 in the circuit block 210 of the present embodiment may include finFETs or gate-all-around (GAA) FETs as the block transistors 230. Further, although the circuit block 210 is represented by a single block transistor 230 in the circuit block 210, embodiments of the present invention will typically have a circuit block 210 that contains many block transistors 230 within the circuit block 210. Furthermore, although the electronic device is represented as a single circuit block 210, embodiments of the present invention will typically have an electronic device that contains many circuit blocks 210 within the electronic device. Furthermore, although a single TFET footer transistor 220 is shown, there will also typically be specifically-designed TFET footer transistors 220 for power gating the many circuit blocks 210 within the electronic device. In some embodiments, the number of block transistors 230 may be 10 times, 100 times, or more the number of TFET footer transistors 220 used to power gate the circuit block 210. Furthermore, the various specifically-designed TFETs used as TFET footer transistors 220 may have subthreshold slopes that are different from one another, thereby enabling different sleep/wakeup scenarios (e.g., some sleep/wakeup scenarios may have faster wakeup speed vs. lower current leakage, such as a longer hibernation mode for which a TFET will have a steeper subthreshold slope to have lower leakage, but also to have lower on-current).

Performance achieved by using the TFET footer transistor 220 to power gate the circuit block 210 may also depend on the virtual ground voltage Vvgnd 212. The virtual ground voltage Vvgnd 212 is the voltage at the node between the circuit block 210 and the TFET footer transistor 220. The subthreshold slope of the TFET footer transistor 220 effectively controls the virtual ground voltage Vvgnd 212, and the virtual ground voltage Vvgnd 212 in turn determines characteristics corresponding to leakage savings, wakeup speed, and power (e.g., the greater the leakage savings, the slower the wakeup speed, and the greater the amount of power required to switch the circuit block 210 from standby to on). Accordingly, the virtual ground voltage Vvgnd 212 may be increased for lower subthreshold slope TFET at iso-Vt (with CMOSFETs) to increase leakage savings, and may be reduced for lower subthreshold slope TFET at iso-leakage to increase wakeup speed. Additionally, the switching wakeup energy may be proportional to the square of virtual ground voltage Vvgnd 212.

Accordingly, the virtual ground voltage Vvgnd 212 is effectively a key knob that can be tuned to optimize the standby mode current leakage versus wake up optimization. The gate voltage and the subthreshold slope of the TFET footer transistor 220 can be used to control the virtual ground voltage Vvgnd 212. A higher virtual ground voltage Vvgnd 212 results in higher leakage power savings at the expense of higher switching energy during wake up.

The virtual ground voltage Vvgnd 212 of the present embodiment may be less than or equal to about 0.5 volts to ensure that a drain-side, band-to-band induced parasitic leakage floor is less than or equal to about 1e-11 A/µm, or may be less than or equal to about 0.4 volts to ensure that a drain-side, band-to-band induced parasitic leakage floor is less than or equal to about 1e-12 A/µm.

Additionally, the gate voltage of the TFET footer transistor 220 of the present embodiment may be modulated to be between about 0.0 volts and about 0.5 volts to establish a desired design compromise between wakeup switching energy and standby mode leakage.

Figure 3:
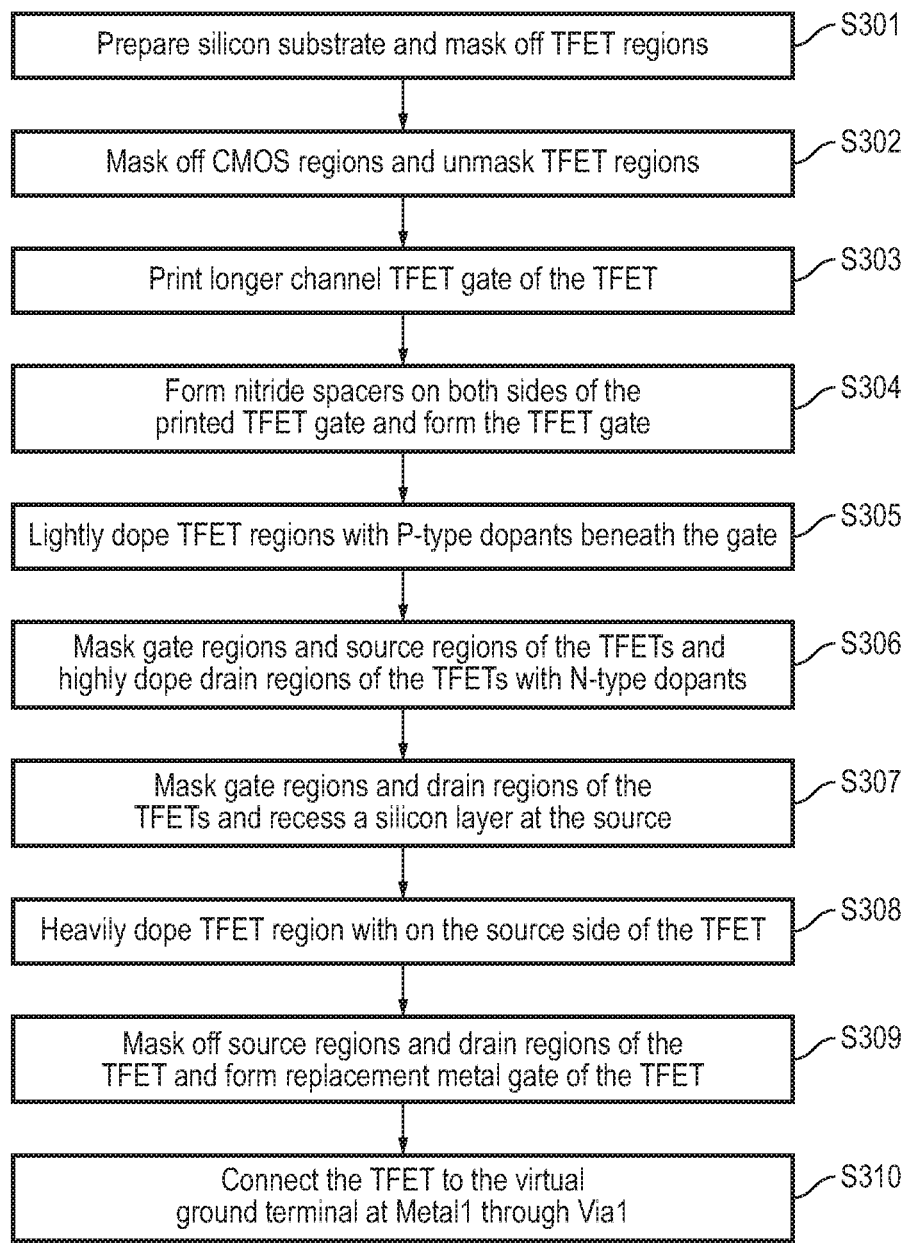
FIG. 3 is a flowchart of a manufacturing method of an integrated circuit including a circuit block that is power gated with a TFET, according to an embodiment of the present invention.

FIG. 3 is a flowchart of a manufacturing method of an integrated circuit including a circuit block that is power gated with a TFET, according to an embodiment of the present invention.

For example, the TFET footer transistor 220 of the embodiment of FIG. 2 may also be made of the same materials as those used in the conventional MOSFET manufacturing flow/manufacturing process (e.g., the same materials as those used to make the NMOS footer transistor 120 in FIG. 1, or to make the block transistors 230 of the circuit block 210). Accordingly, manufacture of a logic microprocessor using CMOS block transistors 230 in the circuit block 210 while using the TFET footer transistor 220 for power gating may require few additional steps.

With respect to manufacture of a device that is similar to that disclosed above with reference to FIG. 2, by integrating a TFET for power gating a circuit block with a logic microprocessor, one or more additional steps to manufacture the integrated circuit may be used during fabrication. However, the integrated circuit may be fabricated while using only one additional mask when compared to the manufacturing process of an integrated circuit using a CMOSFET for power gating a circuit block (e.g., as shown in FIG. 1). The additional mask may be used to distinguish between the source and drain of the TFET footer transistor 220, as the source and drain of the MOSFET are symmetrical.

For example, and referring to FIGS. 2, 3 and 4, at S301, an otherwise conventional, state-of-the-art CMOS process flow begins (e.g., preparation of a silicon substrate as the substrate of the integrated circuit/chip). However, unlike the conventional CMOS process flow, TFET regions, which correspond to regions at which the TFETs will be located, are masked off on the silicon substrate.

At S302, CMOS regions of the integrated circuit, which correspond to the regions at which the block transistors 230 of the circuit block 210 will be located, are masked off, and the TFET regions, which correspond to the regions at which the TFET footer transistors 220 will be located, are unmasked/opened up on the existing silicon substrate.

At S303, longer gate length masks for input/output (I/O) or static random-access memory (SRAM) devices may be re-used to print the longer channel TFET gates (e.g., TFET gates 222 of the TFET footer transistors 220, or TFET gate terminal 470 of the TFET 400). For example, the initial gate material may be sacrificial polysilicon.

At S304, nitride spacers (e.g., the spacers 490 of the TFET 400 shown in FIG. 4) may be formed on both sides of a dummy poly gate (e.g., both sides of the gate terminal 470) for forming the TFET gate 222 of the TFET footer transistor 220.

At S305, the TFET region of the silicon substrate may be lightly doped (e.g., less than or equal to about 5e17 cm$^{-3}$, including the case of undoped) with p-type dopants, such as boron, beneath the gate.

At S306, gate regions and source regions respectively corresponding to gates of the TFETs and sources of the TFETs (e.g., silicon channel region 420 corresponding to the gate terminal 470, and source region 410 corresponding to the source terminal 460) may be masked off, and drain regions corresponding to the drains of the TFETs (e.g., drain region 430 corresponding to the drain terminal 450) may be highly doped with (e.g., from about 5e18 cm$^{-3}$ to about 1e20 cm$^{-3}$, or greater) with n-type dopants, such as phosphorus.

At S307, channel regions and drain regions (e.g., silicon channel region 420 and drain region 430) may be masked off, and a silicon layer may be recessed only at the source region (e.g., the source region 410) by using, for example, isotropic etching.

At S308, the TFET region may be very heavily doped (e.g., greater than or equal to about 1e19 cm$^{-3}$ with boron as dopant) with, for example, very heavily doped pure germanium or silicon-germanium grown on the source side (e.g., in the source region 410) of the TFET. In the process of the present embodiment, the TFET may be made of a group IV material. Further, dopants for forming the source and drain regions of the TFET, and/or for forming the CMOSFETs of the circuit block may include a group V or group III material.

At S309, the source regions and drain regions of the TFETs (e.g., source region 410 and drain region 430) are masked off, and a replacement metal gate process may follow to deposit a high dielectric constant (HiK) oxide and an appropriate n-type workfunction metal as the replacement metal gate (e.g., as the gate terminal 470).

At S310, the TFET (e.g., TFET footer transistor 220) may be connected to the virtual ground terminal (e.g., the terminal corresponding to the virtual ground voltage Vvgnd 212) at the Metal1 level of the integrated circuit (e.g., is a Metal1 connection) through a via hole (e.g., through Via1), wherein the used via process is a standard via process where a via hole in inter-layer dielectric (ILD) is filled with via metal like copper or cobalt.

As described above, by using a TFET as a footer transistor instead of a MOSFET, embodiments of the present invention are able to reduce a ratio of standby mode leakage to active mode leakage current being lower by around 100× or more.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. An integrated circuit (IC) comprising:
   a circuit block coupled to a supply voltage and comprising a plurality of complementary metal oxide semiconductor field-effect transistors (CMOSFETs); and
   a tunnel field-effect transistor (TFET) between the circuit block and ground for power gating the circuit block by blocking an amount of current flowing from the circuit block to ground during a standby mode,
   wherein the circuit block is between the TFET and the supply voltage.

2. The IC of claim 1, wherein a subthreshold slope of the TFET is less than or equal to about 59 mV/decade at room temperature.

3. The IC of claim 1, wherein the TFET comprises a group IV material.

4. The IC of claim 1, wherein the TFET comprises a drain region and a source region, and
   wherein dopants of CMOSFETs of the circuit block and dopants of the drain region of the TFET or of the source region of the TFET comprise a group V or group III material.

5. The IC of claim 1, wherein a gate region of the TFET overlaps a source region of the TFET to a greater degree than the gate region of the TFET overlaps a drain region of the TFET.

6. The IC of claim 1, wherein the TFET is an n-type TFET.

7. The IC of claim 1, wherein the TFET is connected through a Via1 to a virtual ground terminal metal at a Metal1 level of the IC.

8. The IC of claim 1, wherein the TFET has a gate length that is greater than or equal to about twice a gate length of an average CMOSFET of the circuit block.

9. The IC of claim 1, wherein the TFET has a width that is greater than or equal to about five times a width of an average CMOSFET of the circuit block.

10. A method of integrated circuit (IC) fabrication the method comprising:
    preparing a silicon substrate;
    masking off TFET regions;
    preparing CMOSFETs corresponding to a circuit block of the IC;
    unmasking the TFET regions; and
    preparing a plurality of TFETs at the TFET regions by:
       preparing gates of the TFETs by reusing gate length masks used for preparing input/output (I/O) or static random-access memory (SRAM) devices;
       forming nitride spacers on both sides of the gates; and
       doping the TFET regions,
    wherein the TFETs are for power gating the circuit block by blocking an amount of current flowing from the circuit block to ground during a standby mode, the circuit block being between the TFETs and ground.

11. The method of claim 10, wherein doping the TFET regions comprises:
    lightly doping the TFET region with p-type dopants;
    masking gate regions and source regions of the TFET regions;
    doping drain regions of the TFET regions;
    unmasking the source regions and masking the drain regions;
    recessing a silicon layer; and
    doping the source regions with p-type dopants.

12. The method of claim 10, wherein preparing the gates comprises forming gate lengths of the TFETs to be longer than gate lengths of the CMOSFETs of the circuit block.

13. The method of claim 10, wherein preparing the TFETs at the TFET regions further comprises forming replacement metal gates as gates of the TFETs.

14. The method of claim 13, wherein forming replacement metal gates as gates of the TFETs comprises depositing a high dielectric constant (HiK) oxide and an appropriate n-type workfunction metal.

15. The method of claim 10, further comprising connecting the TFETs to a virtual ground terminal of the circuit block at a Metal1 level of the IC.

16. The method of claim 10, wherein preparing the TFETs at the TFET regions comprises forming the TFETs to be wider than the CMOSFETs of the circuit block.

17. A logic microprocessor comprising:
    a circuit block coupled to a supply voltage and comprising complementary metal oxide semiconductor field-effect transistors (CMOSFETs); and
    one or more tunnel field-effect transistors (TFETs) for power gating the circuit block by blocking an amount of current flowing from the circuit block to ground during a standby mode,
    wherein the circuit block is between the one or more TFETs and the supply voltage, and
    wherein the one or more TFETs are between ground and the circuit block.

* * * * *